(12) United States Patent
Witvrouw et al.

(10) Patent No.: US 6,740,542 B2
(45) Date of Patent: May 25, 2004

(54) METHOD FOR PRODUCING MICROMACHINED DEVICES AND DEVICES OBTAINED THEREOF

(75) Inventors: Ann Witvrouw, Herent (BE); Atze de Vries, Leuven (BE); Piet De Moor, Linden-Lubbeek (BE); Luc Haspeslagh, Lubbeek-Linden (BE); Brigitte Parmentier, Leuven (BE); Agnes Verbist, Winksele-Herent (BE); Constantine Anagnostopoulos, Mendon, NY (US)

(73) Assignees: Interuniversitair Microelektronica Centrum, Leuven (BE); Eastman Kodak Company, Rochester, NY (US)

( * ) Notice: Subject to any disclaimer, the term of this patent is extended or adjusted under 35 U.S.C. 154(b) by 53 days.

(21) Appl. No.: 09/973,277

(22) Filed: Oct. 9, 2001

(65) Prior Publication Data

US 2002/0108926 A1 Aug. 15, 2002

Related U.S. Application Data

(60) Provisional application No. 60/239,226, filed on Oct. 10, 2000.

(30) Foreign Application Priority Data

Oct. 9, 2000 (EP) .......................................... 008702276

(51) Int. Cl.⁷ .......................... H01L 21/44; H01L 21/66
(52) U.S. Cl. .......................... 438/110; 438/15; 438/973
(58) Field of Search .............................. 438/15, 16, 110, 438/689, 943, 947, 973

(56) References Cited

U.S. PATENT DOCUMENTS

| | | | |
|---|---|---|---|
| 4,278,987 A | 7/1981 | Imaizumi et al. | 357/48 |
| 4,969,359 A | 11/1990 | Mikkor | 73/517 |
| 6,213,050 B1 * | 4/2001 | Liu et al. | 118/723 |
| 6,245,584 B1 * | 6/2001 | Marinaro et al. | 438/14 |
| 6,440,616 B1 * | 8/2002 | Izuha et al. | 430/5 |

FOREIGN PATENT DOCUMENTS

| | | |
|---|---|---|
| DE | 3435 138 A1 | 4/1986 |
| EP | 0 562 880 A1 | 3/1993 |
| EP | 0 658 927 A1 | 10/1994 |
| JP | 3219618 | 9/1991 |

* cited by examiner

*Primary Examiner*—Amir Zarabian
*Assistant Examiner*—Pamela E Perkins
(74) *Attorney, Agent, or Firm*—McDonnell Boehnen Hulbert & Berghoff LLP

(57) ABSTRACT

The present invention is related to a method for producing micromachined devices for use in Microelectromechanical Systems (MEMS), comprising the steps of providing a crystalline wafer, and processing from said wafer at least one micromachined device comprising at least one elongated opening and/or cavity, having a longitudinal axis, so that said longitudinal axis is at an angle to a direction which lies along the intersection of the front plane of the wafer and a cleavage plane, said cleavage plane being defined as a plane along which cleavage of the wafer is most likely to occur.

23 Claims, 9 Drawing Sheets

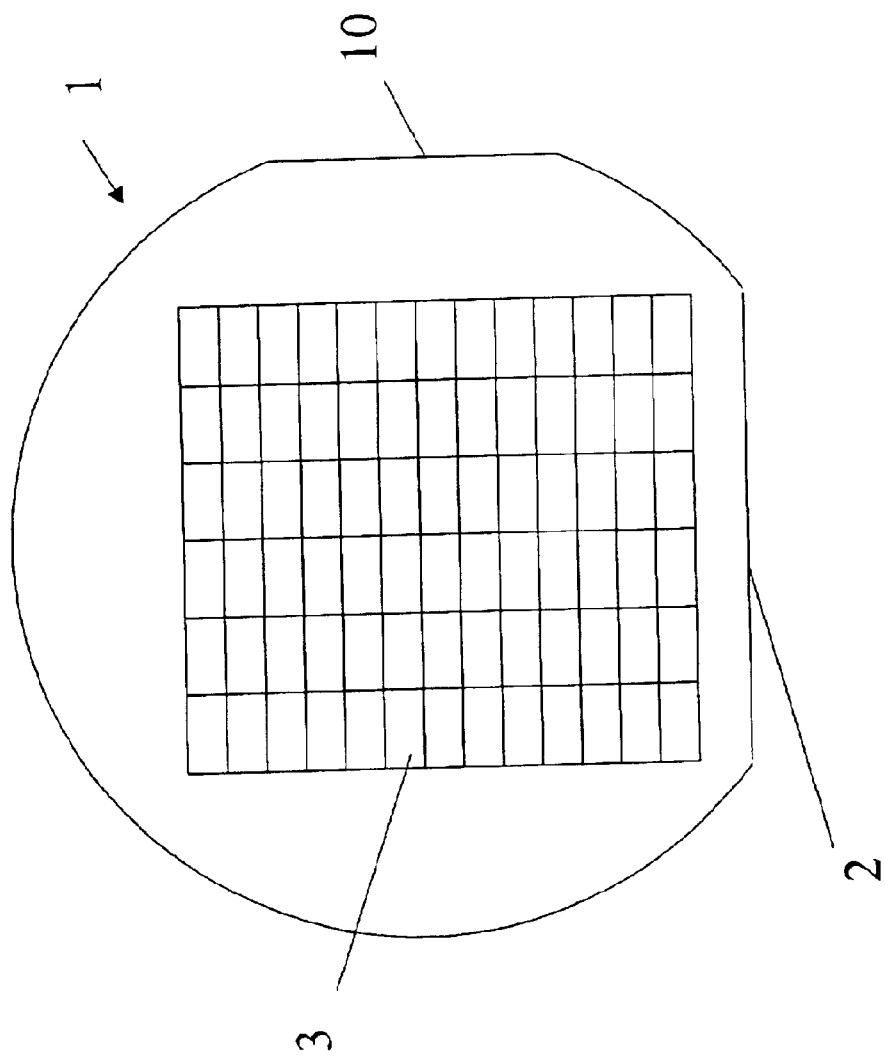

US 6,740,542 B2

METHOD FOR PRODUCING MICROMACHINED DEVICES AND DEVICES OBTAINED THEREOF

REFERENCE TO RELATED APPLICATIONS

The current patent application claims priority to European Patent Application Ser. No. 008702276 filed on Oct. 9, 2000. The current patent application claims priority to U.S. Patent Application Ser. No. 60/239,226 filed on Oct. 10, 2000 entitled "A METHOD FOR PRODUCING MICROMACHINED DEVICES AND DEVICES OBTAINED THEREOF." This application incorporates by reference U.S. Patent Application Ser. No. 60/239,226 in its entirety.

FIELD OF THE INVENTION

The present invention is related to a method for producing micromachined devices for use in Microelectromechanical Systems (MEMS). The present invention is also related to the devices obtained by said method and the use of said devices.

STATE OF THE ART

In Microelectromechanical Systems (MEMS), also known as Microsystems or Micro Machined Systems, devices are often used the production of which is based on the method technology developed in semiconductor processing, combined with specific MEMS technology. In MEMS technology, structures such as beams or cavities, can be added to micro-electronic circuitry. Compared to standard semiconductor devices, the mechanical properties of these micromachined devices are subject to very demanding criteria, in terms of breaking behaviour, weight, vibration resistance, etc., which impose higher standards on the processing of these devices.

To produce certain types of micromachined devices, the method of bulk micromachining is used, wherein wells are etched in a semiconductor wafer, leaving membranes, openings or beams. This device created include, for example, pressure sensors, accelerometers, inclinometers, or optical devices.

In the case of bulk micromachined accelerometers, for example, openings are etched in the semiconductor wafer. Often, these openings are large and narrow, resembling elongated cracks in the wafer.

In general, it is true that cavities or openings are formed in micromachined devices, which are large and deep in comparison to openings normally defined in semiconductor processing, such as contact or via holes, which have a diameter typically less than 5 $\mu$m and a depth less than 2 $\mu$m. Such large openings or cavities are responsible for a weakening of the wafer and increase the chance of the wafer breaking under the influence of stresses induced, for example, during processing.

It is known in the state of the art to exploit certain qualities related to the crystal structure of a semiconductor, such as in a Si wafer. For example, the etching of openings parallel to the <100> direction is beneficial in the case of anistropic wet etching steps. This is described in documents such in EP-A-0658927 and U.S. Pat. No. 4,969,359, for example. However, narrow openings parallel to the <100> direction tend to weaken the wafer considerably, and increase the danger of unintended breaking by cleavage during processing.

In document EP-A-0562880, a semiconductor infra-red emitting device or LED on a substrate is described, the substrate being slanted with respect to the LED stack. The slanted orientation of the devices on the substrate is meant to obtain cleavage of the substrate in a predefined way. This document is not related to avoiding cleavage and thus mechanical failure, but to obtaining this cleavage. Neither is this document related to the production of MEMS, comprising openings or cavities. It is merely a way of dividing a wafer into separate devices by way of cleavage. The same is true of the document DE-A-3435138, which describes a way of obtaining single chips by cleavage, with a reduced risk of splitting a wafer along a second direction perpendicular to the intended direction.

U.S. Pat. No. 4,278,987 describes a semiconductor device prepared according to a method wherein a dent is etched and subsequently filled, said dent having a polygonal shape having main sides parallel to a direction along <100> or inclined within 25° with respect to <100>. The purpose for this slanted position is not for mechanical strength purposes, but for epitaxial growth and planarization purposes. Devices according to this document are not MEMS.

Document JP-A-03219618 is related to cleaving wafers for SEM inspection. Crystal structure orientation is used to obtain cleavage through a device, not to prevent it.

AIMS OF THE INVENTION

The present invention aims to provide a method for producing micromachined devices which have a higher resistance to crack propagation during and after processing.

A further aim of the present invention is to provide micromachined devices having improved resistance to crack propagation.

SUMMARY OF THE INVENTION

The present invention is related to a method for producing micromachined devices for use in Microelectromechanical Systems (MEMS), comprising the steps of:

providing a crystalline wafer, processing from said wafer at least one micromachined device comprising at least one elongated opening and/or cavity, having a longitudinal axis so that said longitudinal axis is at an angle to a direction which lies along the intersection of the front plane of the wafer and a cleavage plane, said cleavage plane being defined as a plane along which cleavage of the wafer is most likely to occur.

The present invention is related in particular to a method, wherein said wafer has the shape of a circular disc, with at least one part cut off along a chord of said circular disc, the longest of said chords being called 'the flat' of said wafer.

According to a first preferred embodiment of the present invention, said flat is not parallel to said intersection.

According to a second preferred embodiment of the present invention, said flat is parallel to said intersection.

In a preferred embodiment of the present invention, said wafer is a silicon wafer, whose front and back surfaces are oriented along a plane of the {100} family and wherein said cleavage plane is a plane belonging to the {111} or the {110} family. In these latter cases, said angle between said longitudinal axis of said opening and/or cavity and said direction is less than 45°.

In the embodiment wherein said flat is oriented along said intersection, the method according to the invention comprises the steps of:

subjecting said wafer to a photolithography step, whereby a pattern is printed through a mask onto said wafer, etching said wafer,
wherein said photolithography step comprises the step of rotating said mask over an angle, with respect to said wafer, or wherein said pattern is positioned at an angle with respect to said mask, or wherein said photolithography step comprises the step of rotating said wafer over an angle with respect to said mask.

According to the embodiment wherein said flat is oriented along said intersection, said photolithography step may comprise a contact printing step or a proximity printing step.

In the embodiment wherein said flat is not oriented along said intersection, the method according to the invention comprises the steps of:

subjecting said wafer to a photolithography step, whereby a pattern is printed through a mask onto said wafer,
etching said wafer,
wherein said photolithography step may comprise a contact printing step, a proximity printing step or a number of projection printing steps.

The present invention is also related to a micromachined device for use in Microelectromechanical Systems, said device being produced according to the method of the invention.

The present invention is also related to the use of a micromachined device, said device being produced according to the method of the invention.

DESCRIPTION OF THE DRAWINGS

FIG. 1b describes an alternative form of a standard {100} Si-wafer.

DETAILED DESCRIPTION OF THE INVENTION

Figure 1A:
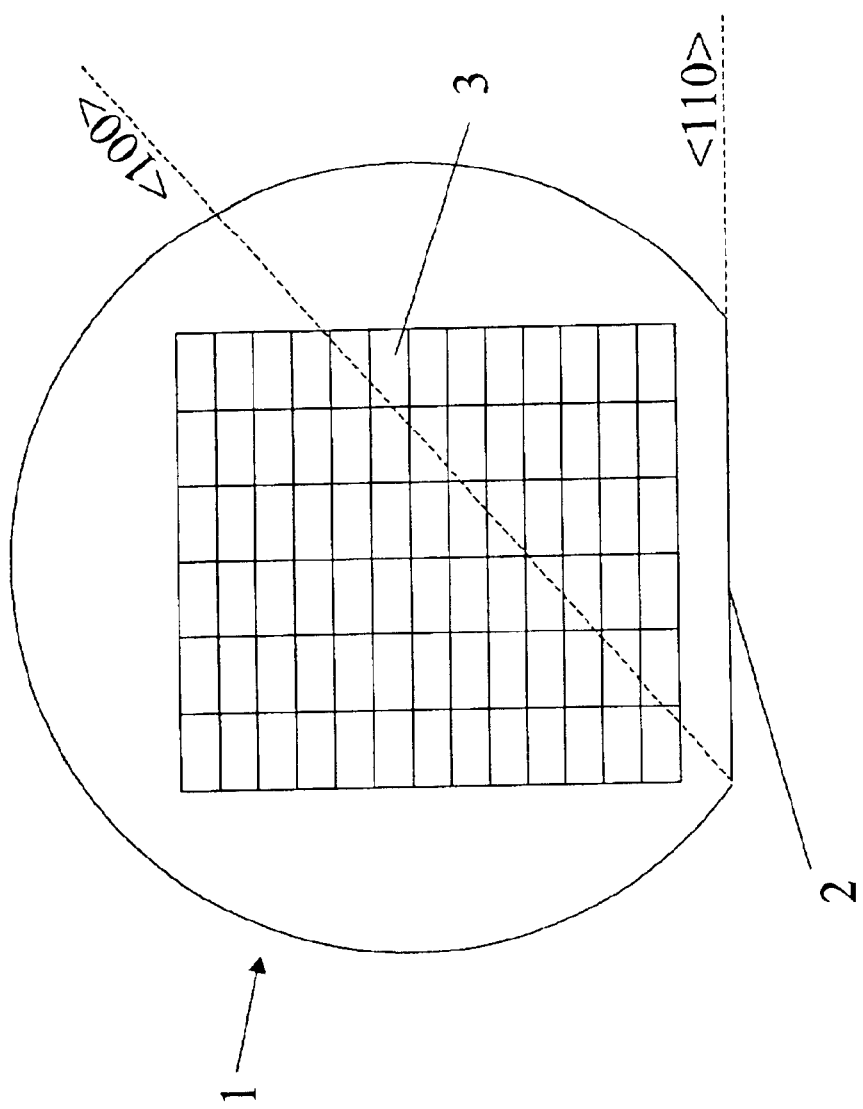
FIG. 1a describes the orientation of the dies on a standard {100} Si-wafer in standard processing.

Semiconductor wafers may be delivered in a variety of shapes. One shape in which most semiconductor wafers are delivered is shown in FIG. 1a in the form of circular shaped flat discs 1, with a straight edge 2 or 'flat' along a chord of the circular disc, said flat being used for positioning the wafer during processing. An additional straight edge 10 may be present, as shown in FIG. 1b, which may be shorter in length than the flat 2. In the following, the term 'flat' refers to the longest straight edge of a wafer.

In the case of standard semiconductor devices, a wafer may be partitioned into a number of 'dies' 3, which, after processing, may be separated to yield single chips. The partitioning may be into dies of equal or non-equal dimensions. The partitioning into dies of equal dimensions is typical for devices produced on the basis of a projection printing process, such as step-and-repeat printing. Other printing processes, such as those using a contact or proximity printer, allow other configurations, such as the one shown in FIG. 1c. The following description is based on the exemplary case of FIG. 2a, wherein the micromachining consists of producing a device 5 containing a long and narrow opening 4, from a wafer 1 with flat 2. However, the invention may be applied to cases other than that shown in FIG. 2a.

Under the influence of a load applied to the wafer, such as mechanical or thermal forces or shocks, the opening 4 may propagate, leading to breaking of the wafer. Breaking will occur along a so-called cleavage plane. The question whether or not the wafer will break and along which cleavage plane depends on a variety of factors including, for example, the form of the opening, the stress applied, and/or the orientation of the wafer's crystal structure with respect to the opening. It is the stress concentration around crack tips or other discontinuities which causes wafers to break, even though the wafer is subjected to an overall stress level which is far below the material's yield strength.

Figure 2A:
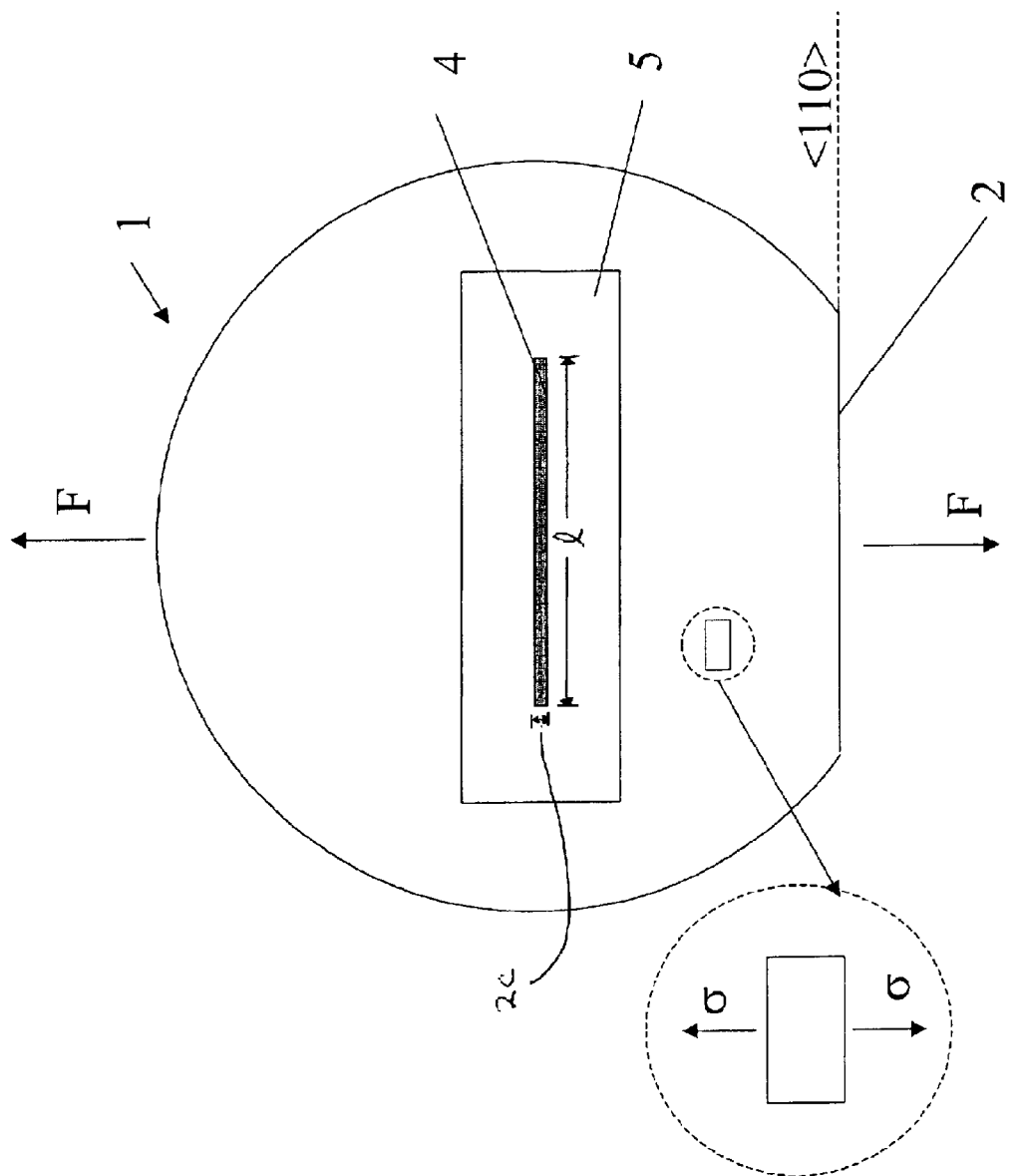
FIG. 2a shows a standard {100} Si-wafer with a long and narrow opening etched out.
Figure 3A:
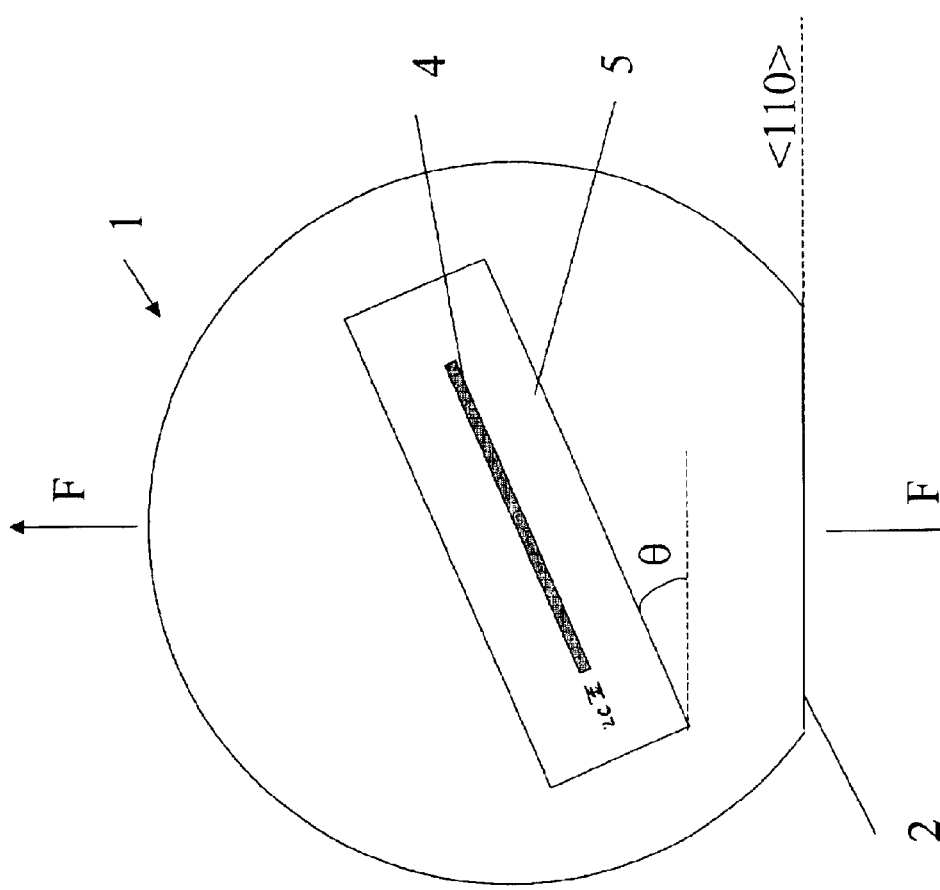
FIG. 3a shows a standard {100} Si-wafer wherein the device to be produced is tilted over an angle θ with respect to the flat.

In general, when a crack of length $2c$ (as shown in FIGS. 2a and 3a) is formed in a material, subjected to a stress a in the homogenous material, σ stress intensity factor K is used to numerically evaluate the eventuality of crack propagation. This will be illustrated (see FIG. 2a) for the exemplary case of a tensile stress σ in a silicon wafer, caused by external tensile forces F. It is understood that the stress σ is the tensile stress in the homogenous material, at a sufficiently large distance from the opening 4. In the vicinity of discontinuities (sharp edges, crack tips), the stress level will rise to very high local values, exceeding by far the value σ in the homogenous material. This is why, at acceptable levels of the stress in the homogenous material, breaking of the wafer can be initiated at the edges of openings such as opening 4.

This stress intensity factor K (expressed in MPA$\sqrt{m}$) is given by $$K = \sigma \sqrt{c\pi} \qquad (1)$$

with c, being half of the crack length. Once the stress intensity factor exceeds a critical value $K_c$, the crack will be propagated. This can equally be expressed in terms of a critical applied stress level $\sigma_c$ in the homogenous material:

$$\sigma_c = \frac{K_c}{\sqrt{c\pi}} \qquad (2)$$

When σ exceeds $\sigma_c$, crack propagation begins.

Micromachined devices may use a variety of materials. For example, micromachined devices widely use silicon as a material. It has excellent mechanical properties apart from significant photoelectric and thermoelectric effects and a reasonable carrier mobility.

Many of these properties are related to the crystalline structure of silicon. The atoms in a silicon wafer form a lattice structure, which, when viewed from different angles reveals different patterns of atoms. The planes and directions in a Si-wafer are represented by their Miller indices, which are known in the art.

Three families of planes: {100}, {110} and {111} are important in silicon wafers. Standard Si-wafers are of the {100} type, meaning that their flat front and back surfaces are oriented along a plane belonging to the {100} family. Also in standard Si-wafers, the flat 2 is oriented along a <110> direction which is the common intersection direction between on the one hand planes of the {100} and {110} families and on the other hand of planes of the {100} and {111} families. FIG. 1a also shows the <100> direction, which is the common intersection between on the one hand two planes of the {100} family and on the other hand planes of the {100} and {110} families. The failure of Si-wafers as a consequence of the stress concentrations described above, occurs by a phenomenon called cleavage: this means that the wafer breaks in two along a well defined cleavage plane that depends on the orientation of the stress with respect to the wafer's crystal structure.

In silicon, the value of $K_c$ has been measured for cleavage along the three main Miller index plane families, resulting in the data of table 1 (P. J. Burnett, 'Properties of Silicon', EMIS data review series no. 4, INSPEC, London, UK, 1988, p. 30). This can be interpreted as the likelihood of the wafer cleaving along a plane belonging to each of the three families mentioned.

From this data, it is clear that the {100} family offers the most resistance to cleavage in the presence of a stress concentration, followed by {110} and {111} in that order. However, this does not necessarily mean that cleavage occurs along a plane of the {111} family, as will be explained subsequently.

As stated above, the flat of standard Si-wafers is oriented along the <110> direction. Suppose that the opening 4 is now parallel to said flat, as shown in FIG. 2a (as discussed subsequently, angle θ=0°). Even a relatively low tensile stress σ, as shown in FIG. 2a, will cause a critical stress at the tip of the opening. If a critical stress level is reached, cleavage will occur along the line 6 of FIG. 2b. The cleavage plane depends on the orientation of the stress and the type of stress. A tensile stress or a bending stress may cause cleavage along a plane of the {110} or {111} families. This is because not only the $K_c$ factor is important, but also the projection of the stress perpendicular to the cleavage plane. To decrease the chance of cleavage along any of these planes, the present invention now proposes the following solutions.

One aspect of the present invention proposes a method of processing a wafer, wherein openings are etched at an angle θ with respect to the direction <110>, so that crack propagation is inhibited or reduced. An angle is formed by the intersection of two lines. In one aspect of the invention, the angle θ is formed by the longitudinal axis of the opening (as the first line of the angle θ) and the intersection of the front plane of the wafer and the cleavage plane (the intersection of two planes creating a line, which forms the second line of the angle θ). In particular, the longitudinal axis of the openings is at an angle θ to said direction, the axis being defined as a straight line parallel to the wafer and to the longitudinal dimension of the openings. In the case of a rectangular opening, this longitudinal axis is typically the rectangular's longest symmetry axis. For example, as shown in FIGS. 2a and 3a, the longitudinal axis is the axis perpendicular to the crack 2c (i.e., the axis along the length 1).

FIG. 2a shows the standard situation. The opening 4 is oriented along the <110> direction. Under the influence of a tensile stress σ, perpendicular to <110>, cleavage will occur as soon as a critical stress level is reached.

FIG. 3a shows a first alternative, whereby the device 5 and the opening 4 have been rotated over an angle θ, with respect to <110>. Returning to the exemplary case of a tensile stress perpendicular to the flat, it is now the projection of the crack length 2c on the <110> direction which is to be taken into consideration in order to assess the chance of cleavage along the same plane as in FIG. 2b.

Such cleavage may now occur starting from a higher stress level $\sigma_c'$:

$$\sigma_c' = \frac{K_c}{\sqrt{c\pi\cos\theta}} \quad (3)$$

which is an increase by a factor $\sqrt{1/\cos\theta}$ compared to equation (2). In this manner, the chance of failure of the wafer by cleavage along the same plane as in FIG. 2b has diminished.

In one aspect, the optimal value of θ which minimizes cleavage depends on the material used. In the case of silicon, for example, the orientation along θ will decrease the chance of cleavage along one plane, but care must be taken that cleavage will not occur along another plane. This may happen when the projection of the stress on the direction perpendicular to the opening 4, becomes high enough to initiate cleavage along another plane than the one that was 'reinforced' by tilting the opening 4.

Figure 3B:
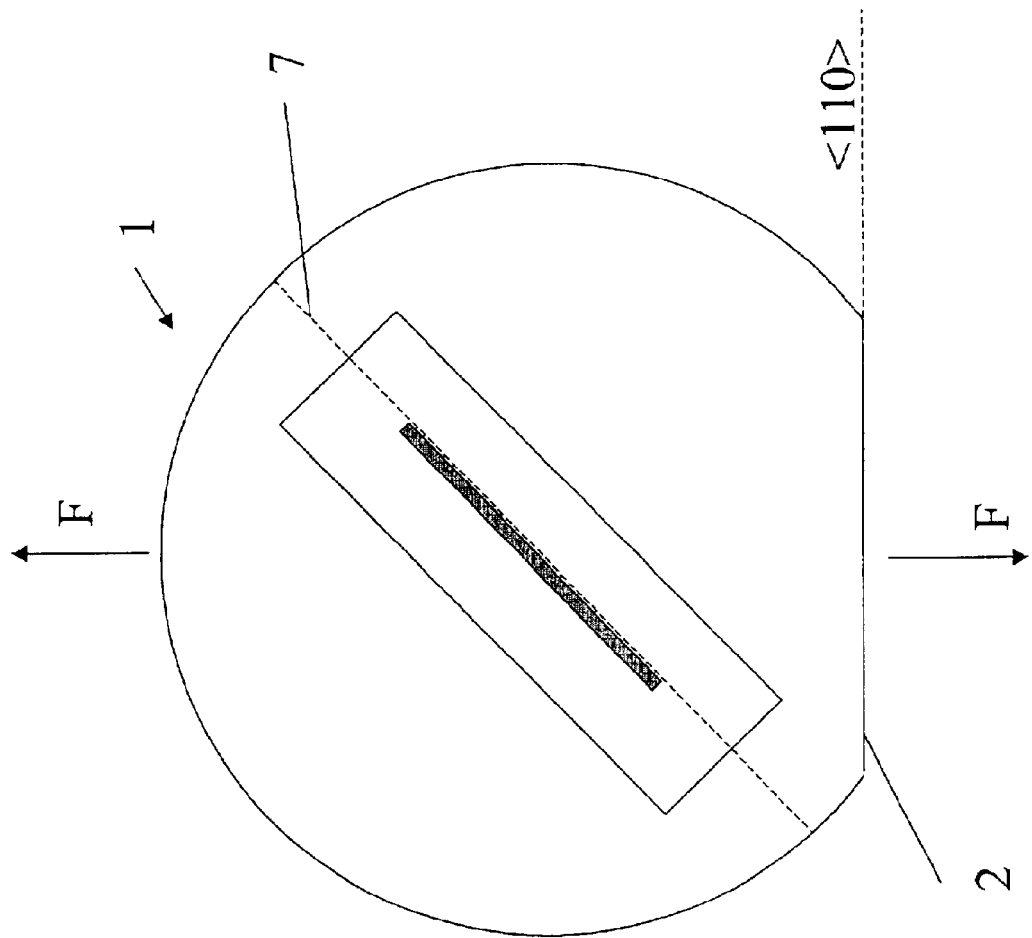
FIG. 3b shows the situation of FIG. 3a wherein θ=45°.

For Si-wafers, the optimal value of θ is between 0° and 45°: at 45°, the opening lies along the <100> direction, which may lead to cleavage along another plane of the {110} family and along a line 7 shown in FIG. 3b.

Figure 4:
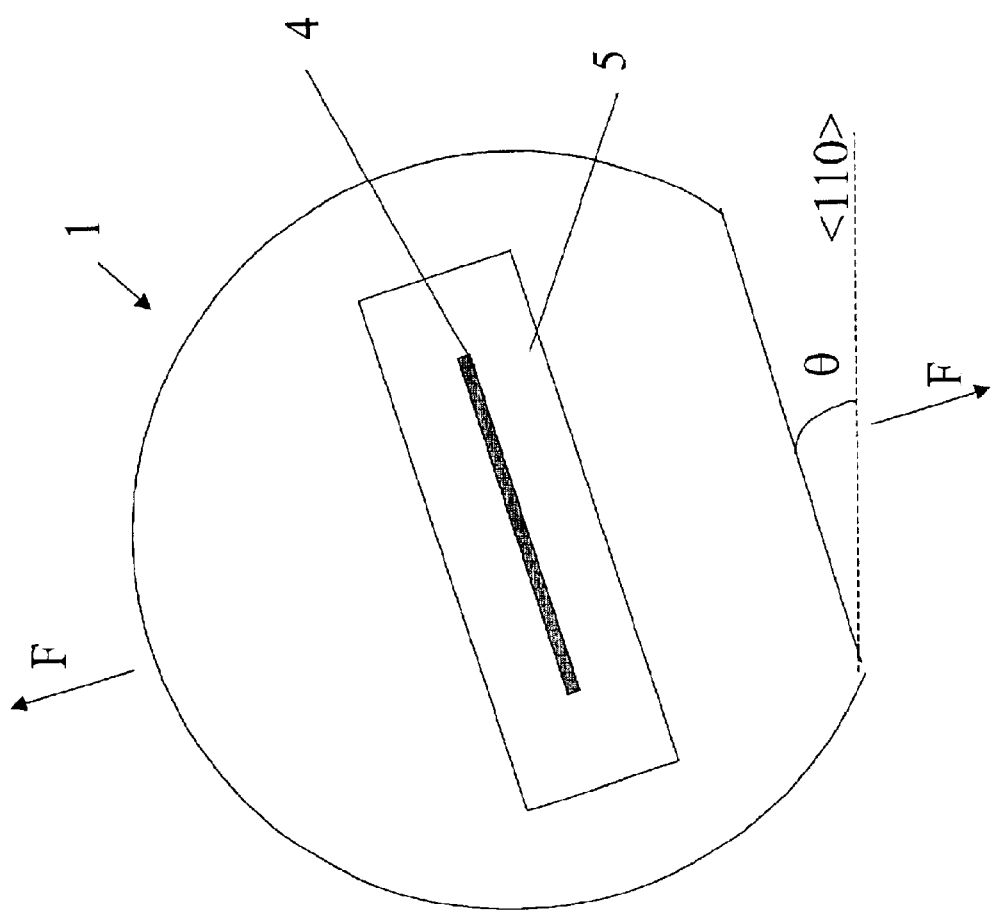
FIG. 4 shows a wafer wherein the device is parallel to the flat, but device and flat are tilted over an angle θ with respect to <110>.

FIG. 4 illustrates a second alternative, wherein the flat of the wafer is no longer oriented along the <110>, but along a direction which is at an angle θ with respect to that <110> direction. The device 5 and the opening 4 remain parallel to the flat, as in the case of standard wafers.

To have a similar situation than the previous, the wafer of FIG. 4 is once again subjected to a tensile stress σ perpendicular to the flat. To assess the chance of the wafer breaking along the same cleavage plane as before, the relevant crack length to be taken into consideration is the projection of the real crack length 2c on the <110> direction. However, this projected length is now subjected to the projection of a on the direction perpendicular to <110>. This means that cleavage will now occur when:

$$\sigma\cos\theta > \frac{K_c}{\sqrt{\pi c\cos\theta}} \quad (4)$$

meaning:

$$\sigma > \frac{K_c}{\cos\theta \cdot \sqrt{\pi c\cos\theta}} \quad (5)$$

Figure 2B:
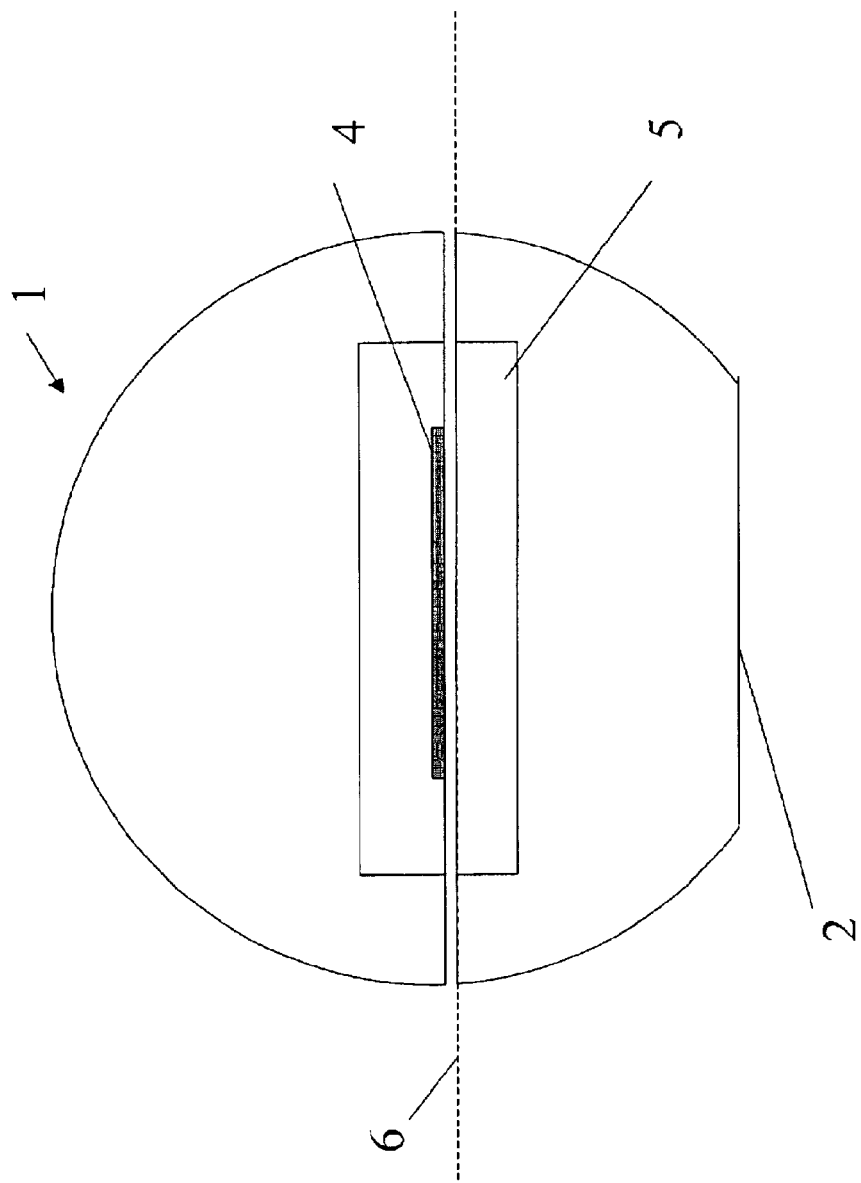
FIG. 2b shows the wafer of FIG. 2a, after cleavage.

In this case, the critical stress at which cleavage along the same plane as in FIG. 2b occurs is further increased by a factor 1/cos θ.

Figure 1C:
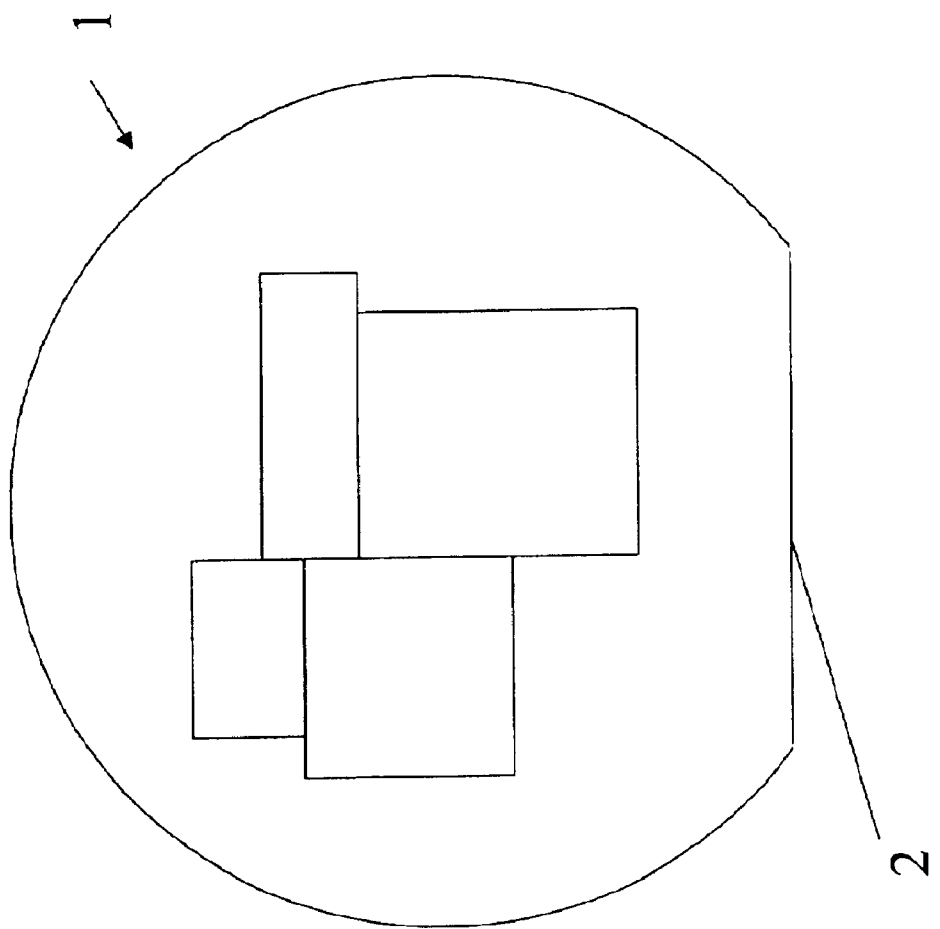
FIG. 1c shows an alternative pattern of devices on a standard wafer.

Based on the two effects described above, three preferred embodiments of the method according to the invention are proposed. According to all embodiments, a wafer is subjected to a process comprising the steps of photolithography and etching, known in the art. The photolithography entails the printing of a pattern of dies, such as shown in FIG. 1a or 1c onto a wafer. This printing step may be performed in different ways. In all cases, the pattern to be printed is produced on a so-called mask, to be placed between a light source and the wafer, in order to print the pattern onto said wafer. In one type of printing, the mask is placed in contact with or very close to the wafer. This is called contact or proximity printing respectively, which are used preferably to print a complete set of dies (as in FIG. 1a or 1c). On the other hand, projection printing methods exist, whereby an optical system is employed between the mask and the wafer, which allows the printed pattern to be reduced in size with respect to the pattern on the mask. This latter method is preferably used when a number of different dies with equal size are printed next to each other on the same wafer, a process also called step-and-repeat printing.

In a first preferred embodiment, illustrated in FIG. 3a, openings are oriented on a standard wafer so that they are placed at an angle θ with respect to the flat and thus to the <110> direction.

According to this embodiment, micromachined devices are produced by a method comprising the steps of photolithography and etching of a Si-wafer, wherein the photolithography step preferably comprises a contact or proximity printing step. To acquire the tilting of the complete set of dies over an angle θ, different actions can be undertaken: the mask can be rotated over that angle with respect to a stationary wafer, prior to photo-exposure of the pattern. This would of course require a printing device which allows such a rotation. Alternatively, the pattern on the mask may placed in a tilted position, at an angle θ with respect to the mask, and then printed through the mask while the mask is in its standard position. This allows the use of a standard printing device. Finally, the wafer itself can be rotated over θ, with respect to a stationary and standard printing device and standard mask. The wafer used in this embodiment of the invention is a standard wafer, with the flat oriented along the <110> direction.

In a second embodiment, illustrated in FIG. 4, openings are parallel to the flat, but the flat itself is tilted at an angle θ with respect to the <110> direction. This type of wafer is not standard and needs to be produced especially in this way.

According to this embodiment, the production method of micromachined devices comprises equally the classic photolithography and etching steps, whereby the photolithography step may equally comprise a contact or proximity printing step. The tilted orientation of the flat with respect to the weaker <110> direction, permits the printing of the set of dies, according to standard processing methods, without necessitating the rotation of the mask, nor of the wafer.

Figure 5:
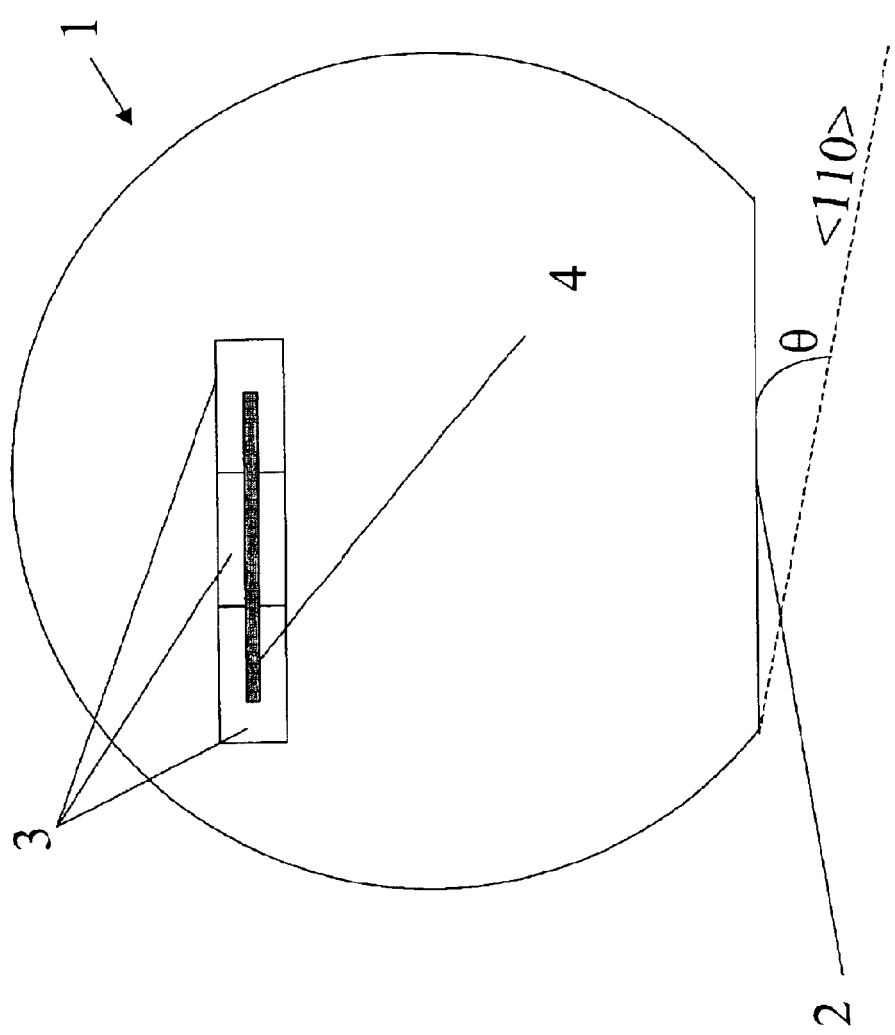
FIG. 5 shows a wafer wherein dies are printed using a step-and-repeat projection printing step in the photolithography.

Apart from that, the method according to the second embodiment of the invention is especially suitable for a method wherein the photolithography is based on projection printing, such as step-and-repeat printing, as illustrated in FIG. 5. As was stated before, this type of printing step is mostly used to acquire a set of dies 3 of identical dimensions, such as shown in FIGS. 1a and 1b. In step-and-repeat printing, the dies 3 are printed separately and consecutively onto the wafer 1. To obtain an orientation of the die and/or the openings defined on it, on a standard wafer (i.e. with the flat parallel to <110>), it would be necessary to perform additional translation/rotation of the wafer between printing steps, in order to align the different dies, which would make the method more complex and time-consuming. With the wafer used in the method according to this embodiment, whereby the flat is not oriented along the <110> direction, the wafer can be processed in the classic way, without additional translation or rotation between printing steps.

In a third preferred embodiment, the orientation at an angle θ is performed by a combination of the first preferred embodiment and the second preferred embodiment. As discussed above, one example of the first embodiment is to maintain the orientation of the wafer (keep the wafer stationary) and adjust the photolithography to achieve the angle θ (for example, by tilting of the complete set of dies over an angle θ). Further, as discussed above, one example of the second embodiment is to modify the orientation of the wafer (for example by rotating the wafer) and maintaining the photolithography. In the third preferred embodiment, the orientation of the angle θ is achieved by a combination of modifying the orientation of the wafer and adjusting the photolithography. The combined effect of which is the orientation at an angle θ.

It is intended that the foregoing detailed description be regarded as illustrative rather than limiting and that it is understood that the following claims, including all equivalents, are intended to define the scope of the invention.

TABLE 1

| Miller index plane | {100} | {110} | {111} |
|---|---|---|---|
| Kc (MPA√mMPA) | 0.95 | 0.9 | 0.82 |

What is claimed is:

1. A method for producing bulk micromachined devices for use in Microelectromechanical Systems (MEMS), comprising the steps of:
   providing a crystalline wafer with a front plane,
   processing from said wafer at least one bulk micromachined device comprising at least one elongated opening or cavity, the opening of cavity having a longitudinal axis, so that an angle is formed by said longitudinal axis and a line formed by intersection of the front plane of the wafer and a first cleavage plane, wherein said longitudinal axis is not paralleled with a second cleavage plane.

2. A method according to claim 1, wherein said wafer has a shape of a circular disc, with one or more parts cut off along one or more chords of said circular disc, the longest of said chords being a flat of said wafer.

3. A method according to claim 2 wherein said flat is not parallel to the intersection of said front plane with said first cleavage plane.

4. A method according to claim 2, wherein said flat is parallel to the intersection of said front plane with said first cleavage plane.

5. A method according to claim 4,
   wherein said wafer has a back plane,
   wherein said wafer is a silicon wafer, whose front and back planes are oriented along a plane of the {100} family, and
   wherein said cleavage plane is a plane belonging to the {111} family.

6. A method according to claim 5, wherein said angle is less than 45°.

7. A method according to claim 4, wherein said wafer is a silicon wafer, whose front and back surfaces are oriented along a plane of the {100} family and wherein said cleavage plane is a plane belonging to the {110} family.

8. A method according to claim 7, wherein said angle is less than 45°.

9. A method according to claim 4, wherein said processing comprises the steps of:
   subjecting said wafer to a photolithography step, whereby a pattern is printed through a mask onto said wafer; and
   etching said wafer,
   characterised in that said photolithography step comprises the step of rotating said mask over an angle with respect to said wafer.

10. A method according to claim 9, wherein said photolithography step comprises a contact printing step.

11. A method according to claim 9, wherein said photolithography step comprises a proximity printing step.

12. A method according to claim 4, wherein said processing comprises the steps of:
   subjecting said wafer to a photolithography step, whereby a pattern is printed through a mask onto said wafer;
   etching said wafer, wherein said pattern is positioned at an angle with respect to said mask.

13. A method according to claim 12, wherein said photolithography step comprises a contact printing step.

14. A method according to claim 12, wherein said photolithography step comprises a proximity printing step.

15. A method according to claim 4, wherein said processing comprises the steps of:
   subjecting said wafer to a photolithography step, whereby a pattern is printed through a mask onto said wafer;
   etching said wafer,
   characterised in that said photolithography step comprises the step of rotating said wafer over an angle with respect to said mask.

16. A method according to claim 15, wherein said photolithography step comprises a contact printing step.

17. A method according to any claim 15, wherein said photolithography step comprises a proximity printing step.

18. A method according to claim 3, wherein said processing comprises the steps of:
   subjecting said wafer to a photolithography step, whereby a pattern is printed through a mask onto said wafer,
   etching said wafer.

19. A method according to claim 18, wherein said photolithography step comprises a number of projection printing steps.

20. A method according to claim 18, wherein said photolithography step comprises a contact printing step.

21. A method according to claim 18, wherein said photolithography step comprises a proximity printing step.

22. A micromachined device for use in Microelectromechanical Systems, said device being produced according to the method described in claim 1.

23. Use of a micromachined device in Microelectromechanical Systems, said device being produced according to the method described in claim 1.

* * * * *